(12) United States Patent
Gunji

(10) Patent No.: US 10,304,857 B2
(45) Date of Patent: May 28, 2019

(54) SEMICONDUCTOR DEVICE, DISPLAY DEVICE AND MANUFACTURING METHOD FOR SEMICONDUCTOR DEVICE

(71) Applicant: Japan Display Inc., Tokyo (JP)

(72) Inventor: Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/700,690

(22) Filed: Sep. 11, 2017

(65) Prior Publication Data
US 2018/0097019 A1    Apr. 5, 2018

(30) Foreign Application Priority Data

Sep. 30, 2016 (JP) ................. 2016-192708

(51) Int. Cl.
*H01L 27/12* (2006.01)
(52) U.S. Cl.
CPC ........ *H01L 27/1218* (2013.01); *H01L 27/124* (2013.01); *H01L 27/1244* (2013.01); *H01L 27/1262* (2013.01)

(58) Field of Classification Search
None
See application file for complete search history.

(56) References Cited

U.S. PATENT DOCUMENTS

| 2013/0002133 A1 | 1/2013 | Jin et al. |
| 2014/0170919 A1* | 6/2014 | Manipatruni ............ D01D 5/00 442/188 |
| 2015/0123107 A1* | 5/2015 | Choi ................... H01L 27/3272 257/40 |

FOREIGN PATENT DOCUMENTS

JP      2013-015835 A    1/2013

* cited by examiner

*Primary Examiner* — Su C Kim
*Assistant Examiner* — David S Wilbert
(74) *Attorney, Agent, or Firm* — Typha IP LLC

(57) ABSTRACT

A semiconductor device includes a substrate having an insulating surface; a circuit including a transistor provided on the insulating surface and including a semiconductor layer, an insulating layer and a conductive layer; and a line provided on the insulating surface, the line extending in a first direction. The line includes a core containing a resin material and a conductive portion covering the core as seen in a cross-sectional view taken along a second direction crossing the first direction.

15 Claims, 20 Drawing Sheets

SEMICONDUCTOR DEVICE, DISPLAY DEVICE AND MANUFACTURING METHOD FOR SEMICONDUCTOR DEVICE

CROSS REFERENCE TO RELATED APPLICATIONS

This application is based upon and claims the benefit of priority from the prior Japanese Patent Application No. 2016-192708, filed on Sep. 30, 2016, the entire contents of which are incorporated herein by reference.

FIELD

An embodiment according to the present invention relates to a semiconductor device, a display device, and a manufacturing method for the semiconductor device.

BACKGROUND

As display devices which are a kind of semiconductor devices and are usable for electric appliances and electronic devices, a liquid crystal display device using an electro-optical effect of a liquid crystal material and an organic EL (electroluminescence) display device including an organic electroluminescence (EL) element have been developed.

Especially, a display device including an organic EL element used as a display element has a large viewing angle, provides high definition display, and is allowed to be formed on a flexible substrate. Japanese Laid-Open Patent Publication No. 2013-015835 discloses a display device including an organic EL element provided on a flexible substrate.

SUMMARY

An embodiment according to the present invention provides a semiconductor device including a substrate having an insulating surface; a circuit including a transistor provided on the insulating surface and including a semiconductor layer, an insulating layer and a conductive layer; and a line provided on the insulating surface, the line extending in a first direction. The line includes a core containing a resin material and a conductive portion covering the core as seen in a cross-sectional view taken along a second direction crossing the first direction.

DESCRIPTION OF EMBODIMENTS

Figure 1A:
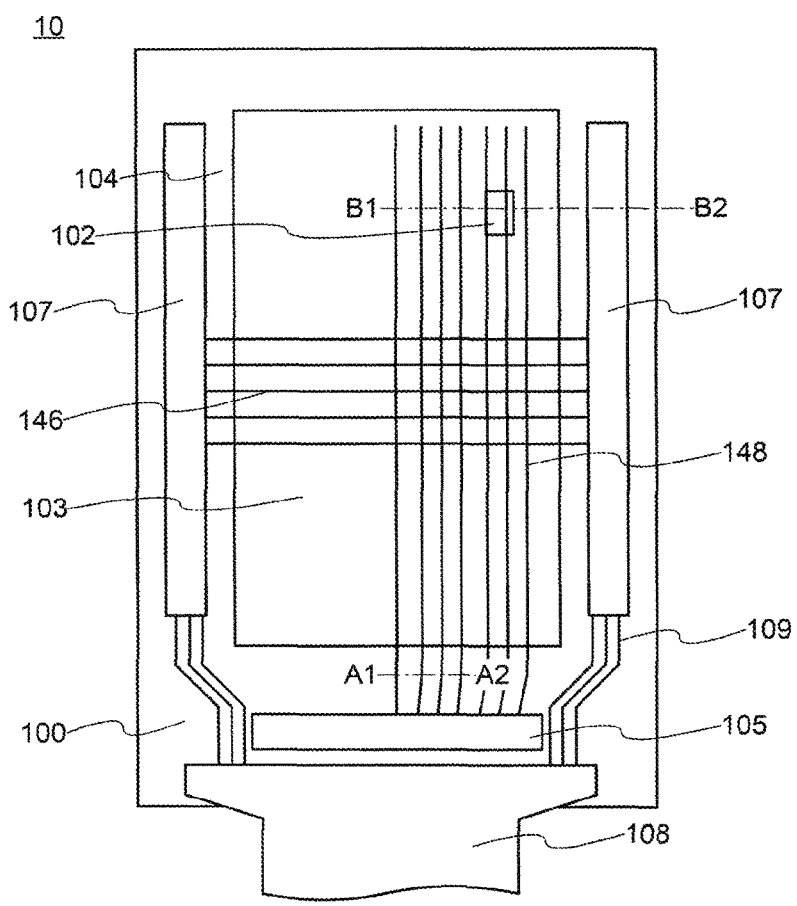
FIG. 1A is a plan view of a display device in an embodiment according to the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto (or identical numerals with "a", "b" or the like provided after the numerals), and detailed descriptions thereof may be omitted. The words "first", "second" or the like provided for components are used merely to distinguish the components from each other, and do not have any further meaning unless otherwise specified.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified. In the following description, unless otherwise specified, the side on which a second substrate is provided with respect to a first substrate as seen in a cross-sectional view will be referred to as "above, and the opposite side will be referred to as "below".

A flexible display device involves an undesirable possibility that when a module is folded, lines in a TFT circuit or a light emitting pixel may be broken. Especially when a line portion is folded, the lines may be cracked to have a high resistance or to become non-conductive (disconnected).

The present invention discloses a semiconductor device, a display device and a manufacturing method for a semiconductor device having an improved bending durability.
(Embodiment 1)

FIG. 1 A is a plan view of a display device 10.
(1. Structure of the Display Device)

As shown in FIG. 1A, the display device 10 includes a substrate 100, a display region 103 including pixels 102, a peripheral region 104, a driving circuit 105 having a function of a source driver, driving circuits 107 having a function of a gate driver, and a flexible printed circuit 108. In the display device 10, the display region 103, the driving circuit 105, the driving circuits 107, and the flexible printed circuit 108 are electrically connected with each other.

For displaying an image on the display region 103, an address signal is supplied from either one of the driving circuits 107 to the display region 103 via a line 146. A data signal is supplied from the driving circuit 105 to the display region 103 via a line 148. Referring to FIG. 1A, a plurality of the lines 146 each have a function of a scanning line. A plurality of the lines 148 each have a function of a signal line. The lines 148 extend in a longitudinal direction of the driving circuits 107. In the example shown in FIG. 1A, the driving circuits 107 are located on both of sides of the display region 103 so as to have the display region 103 therebetween, and the scanning lines 146 are driven from the both sides. The present invention is not limited to having such a structure. The driving circuit 107 may be located on one of the sides of the display region 103.
(2. Structure of the Lines)

Figure 1B:
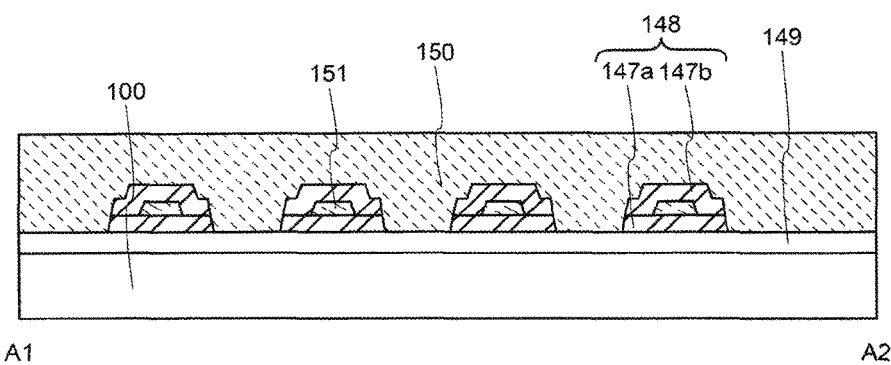
FIG. 1B is a cross-sectional view showing lines and the vicinity thereof in an embodiment according to the present invention.

FIG. 1B is a cross-sectional view of the display device 10 taken along line A1-A2 in FIG. 1A, namely, in a direction crossing the direction in which the lines 148 extend. FIG. 1B shows the lines 148 and the vicinity thereof. As shown in the cross-sectional view taken along line A1-A2 in FIG. 1B, the display device 10 includes at least the substrate 100, the lines 148, an insulating layer 149, an insulating layer 150 and an insulating layer 151.

The insulating layer 149 is provided on the substrate 100. The insulating layer 149 may be formed of an inorganic insulating material such as silicon oxide, silicon nitride or the like, but is not limited to being formed of such a material. The display device 10 may include a transistor including a semiconductor layer, an insulating layer and a conductive layer between the substrate 100 and the insulating layer 149.

The lines 148 are provided on the insulating layer 149. The lines 148 each include a lower conductive layer 147*a* and an upper conductive layer 147*b*. The conductive layer 147*a* and the conductive layer 147*b* may be formed of a metal material or an oxide-based conductive material. For example, the conductive layer 147*a* and the conductive layer 147*b* may each have a stack structure including an aluminum film, a titanium film and an aluminum film.

Figure 2A:
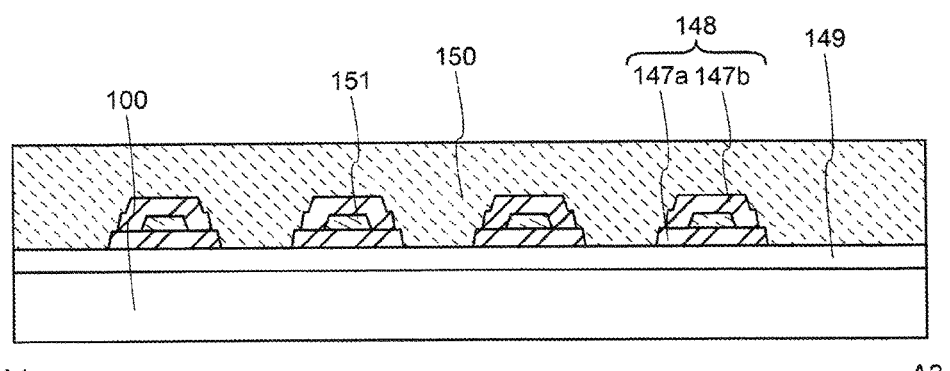
FIG. 2A is a cross-sectional view showing lines and the vicinity thereof in an embodiment according to the present invention.
Figure 2B:
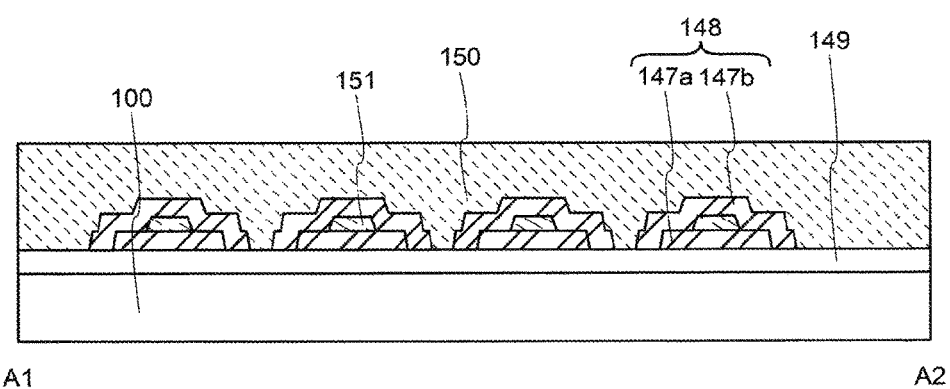
FIG. 2B is a cross-sectional view showing lines and the vicinity thereof in an embodiment according to the present invention.
Figure 2C:
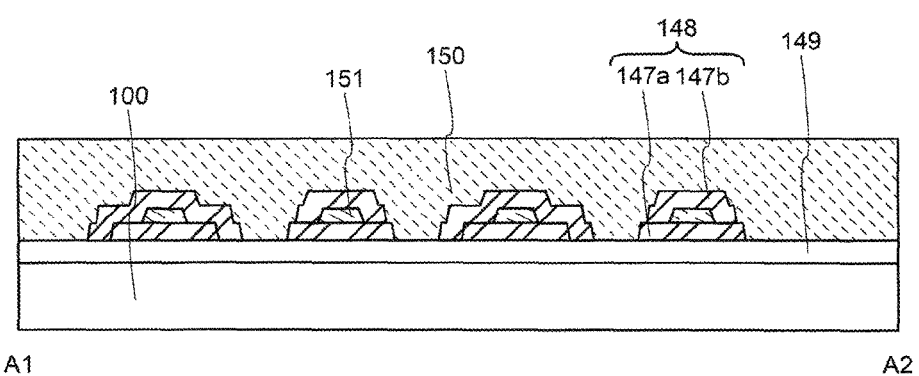
FIG. 2C is a cross-sectional view showing lines and the vicinity thereof in an embodiment according to the present invention.

As shown in FIG. 1B, ends of the conductive layer 147*a* and ends of the conductive layer 147*b* may be at the same position as each other. The ends of the conductive layer 147*a* and the ends of the conductive layer 147*b* may be aligned with each other. Both of two end surfaces of the conductive layer 147*a* and both of two end surfaces of the conductive layer 147*b* may have portions continuous with each other. As shown in FIG. 2A, FIG. 2B and FIG. 2C, the ends of the conductive layer 147*b* may be at different positions from the ends of the conductive layer 147*a*. For example, as shown in FIG. 2A, the ends of the conductive layer 147*b* may be inner to the ends of the conductive layer 147*a*. As shown in FIG. 2B, the ends of the conductive layer 147*b* may be outer to the ends of the conductive layer 147*a*. As shown in FIG. 2C, the display device 10 includes at least one line 148 in which the ends of the conductive layer 147*b* are outer to the ends of the conductive layer 147*a* and at least one line 148 in which the ends of the conductive layer 147*b* are inner to the ends of the conductive layer 147*a*.

The insulating layer 151 is provided between the conductive layer 147*a* and the conductive layer 147*b*. The insulating layer 151 may be formed of an organic resin material or a mixed material of an organic resin material and an inorganic material. The insulating layer 151 may be as thin as, thinner than, or thicker than, the conductive layer 147*a*.

In the above-described structure, the insulating layer 151 is covered with the conductive layer 147*a* and the conductive layer 147*b*. Thus, the lines 148 each have a structure in which the insulating layer 151 is a core and the conductive layer 147*a* and the conductive layer 147*b* act as a conductive portion covering the core.

As seen in a cross-sectional view, the insulating layer 151 may be trapezoidal as shown in FIG. 1B or rectangular. In the case where the cross-sectional shape of the insulating layer 151 is trapezoidal, namely, is tapered, the end surface coverage of the conductive layer 147*b* is improved.

Figure 3:
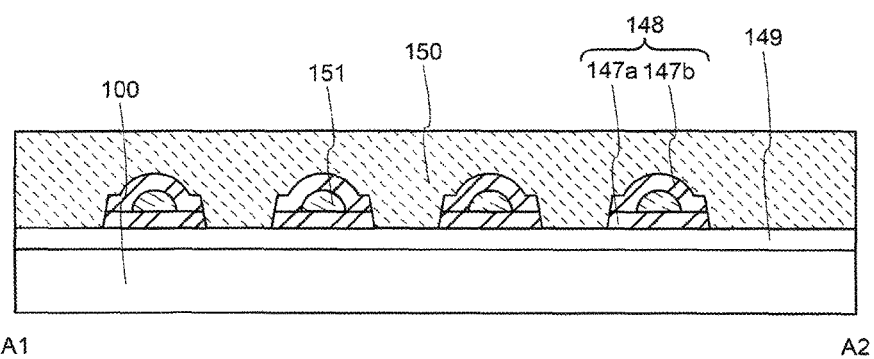
FIG. 3 is a cross-sectional view showing lines and the vicinity thereof in an embodiment according to the present invention.

As shown in FIG. 3, the insulating layer 151 may have a semicircular cross-sectional shape.

The insulating layer 150 is provided on the lines 148 and the insulating layer 149. The insulating layer 150 has a function of a flattening layer, and is formed of an organic insulating material or the like. For example, the insulating layer 150 may be formed of acrylic resin, but is not limited to being formed of such a material.

The insulating layer 150 and the insulating layer 151 may be formed of the same material as, or different materials from, each other. In the case where the insulating layer 150 and the insulating layer 151 are formed of different materials from each other, the material of the insulating material 151 may be harder than the material of the insulating layer 150.

The lines 148 having the above-described structure may be thicker as seen in a cross-sectional view, and thus is more rigid, than lines formed of only the conductive layer 147a or lines having a stack structure of the conductive layer 147a and the conductive layer 147b. This improves the bending durability of the lines 148. Therefore, the display device 10 including the lines 148 has local deformation or generation of cracks suppressed.

The core of each line 148 may be formed of a resin material, so that the influence of strain (compression strain, tensile strain) caused when the line 148 is folded is alleviated. Thus, the display device 10 has the bending durability of the lines 148 improved without including a protective member.

The lines 148 each include the conductive layer 147a, the conductive layer 147b and the insulating layer 151. Therefore, the total area size of the conductive layers 147a and 147b is larger than the area size of the conductive layer 147a only or the total area size of the conductive layer 147a and the conductive layer 147b in the case where the insulating layer 151 is not provided. Such an increased area size lead to the decrease in the line resistance.

In the above-described example, the lines 148 have the above-described structure. The present invention is not limited to this. The lines 146, or power supply lines 109 extending in a direction parallel to, or crossing, the direction in which the lines 148 extend, may have the above-described structure, instead of the lines 148. In such a case, the above-described effects of the lines 148 are also provided by the lines 146 or the power supply lines. With the above-described structure, the driving circuits are decreased in size, which decreases the area size of the peripheral region 104 having a frame shape and also increases the level of definition of the pixels 102.

The above-described lines 148 extend in one direction. Therefore, the display device 10 is easily folded in a direction perpendicular to the direction in which the lines 148 extend. Thus, the display device 10 may have both a property of being easily foldable and a property of not being easily foldable.

(3. Method for Forming the Lines)

Now, a method for forming the lines 148 and the elements in the vicinity thereof will be described with reference to the drawings.

Figure 4A:
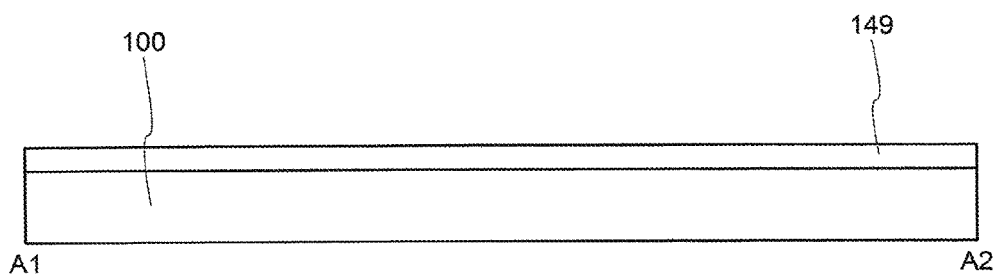
FIG. 4A is a cross-sectional view showing a manufacturing method for the lines and the vicinity thereof in an embodiment according to the present invention.

First, the insulating layer 149 is formed on the substrate 100 (see FIG. 4A). A transistor 110, a transistor 111 and the like provided on an insulating surface described below may be formed between the substrate 100 and the insulating layer 149. The insulating layer 149 may be formed of either an inorganic insulating material or an organic insulating material. Examples of inorganic insulating materials usable for the insulating layer 149 include silicon oxide, silicon nitride, silicon nitride oxide, silicon oxide nitride, siloxane and the like. Examples of organic insulating materials usable for the insulating layer 149 include acrylic resin, epoxy resin, silicone resin, polyimide resin and the like. The insulating layer 149 may be formed by CVD (chemical vapor deposition), spin-coating or printing. For example, the insulating layer may be formed of silicon oxide by plasma CVD.

Figure 4B:
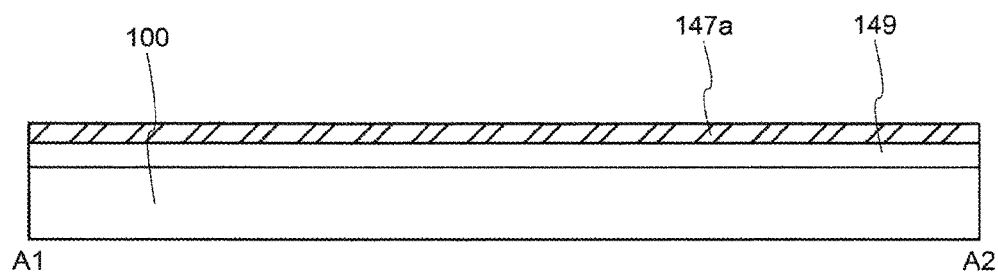
FIG. 4B is a cross-sectional view showing the manufacturing method for the lines and the vicinity thereof in an embodiment according to the present invention.

Next, as shown in FIG. 4B, the conductive layer 147a is formed on the insulating layer 149. The conductive layer 147a is formed of a metal element selected from tungsten, aluminum, chromium, copper, titanium, tantalum, molybdenum, nickel, iron, cobalt, indium or zinc; an alloy containing one of the above-listed metal elements, an alloy of a combination of any of the above-listed metal elements, or the like. Alternatively, the conductive layer 147a may be formed of any of the above-listed materials containing nitrogen, oxygen, hydrogen or the like. For example, the conductive layer 147a may be formed by sputtering, vapor deposition, plating, CVD or the like. For example, the conductive layer 147a may have a stack structure including a titanium (Ti) layer, an aluminum (Al) layer and a titanium (Ti) layer that are formed by sputtering.

Figure 4C:
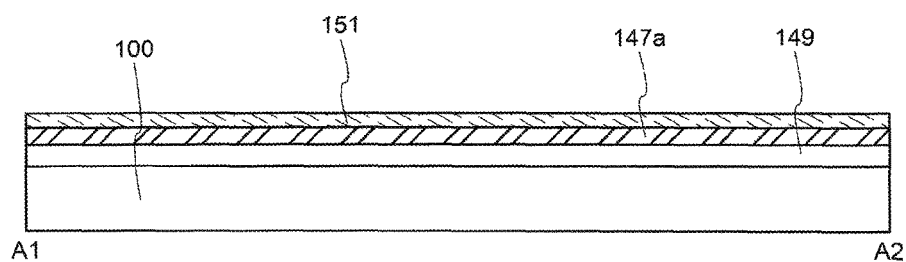
FIG. 4C is a cross-sectional view showing the manufacturing method for the lines and the vicinity thereof in an embodiment according to the present invention.

Next, as shown in FIG. 4C, the insulating layer 151 is formed on the insulating layer 149 and the conductive layer 147a. The insulating layer 151 is formed of an organic insulating material such as acrylic resin, epoxy resin, polyimide resin or the like. The insulating layer 151 may be formed by spin-coating, printing, ink-jetting or the like. For example, the insulating layer 151 may be formed of acrylic resin by spin-coating. It is preferable that the insulating layer 151 is formed to have a thickness of about 100 nm to about 1 μm.

Figure 5A:
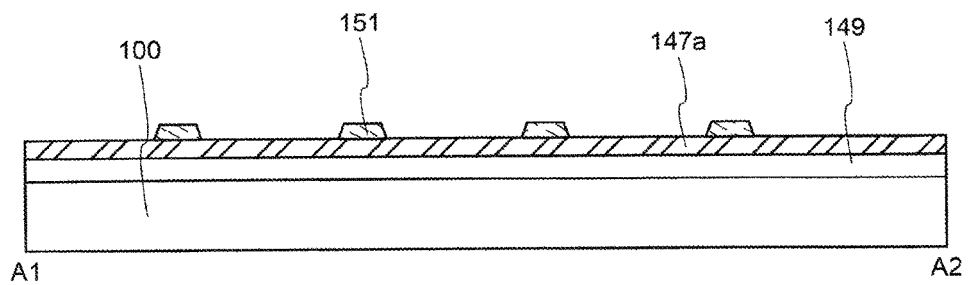
FIG. 5A is a cross-sectional view showing the manufacturing method for the lines and the vicinity thereof in an embodiment according to the present invention.

The insulating layer 151 is processed by a combination of any of photolithography, nanoimprinting, printing, etching and the like to have a predetermined shape (see FIG. 5A). In the case of containing a photosensitive resin, the insulating layer 151 may be processed merely by photolithography. It is preferable that the insulating layer 151 is formed to have a tapered shape.

Figure 5B:
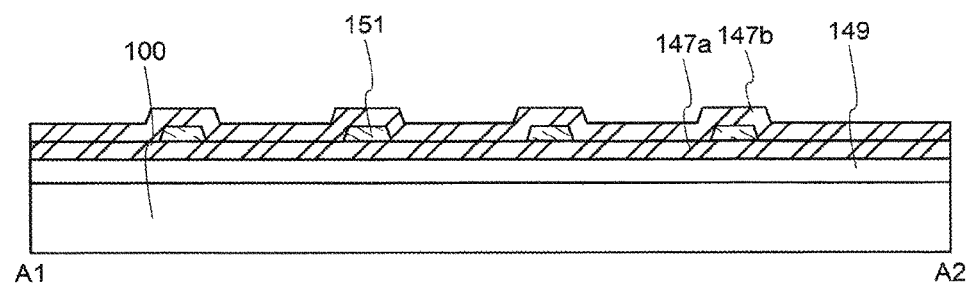
FIG. 5B is a cross-sectional view showing the manufacturing method for the lines and the vicinity thereof in an embodiment according to the present invention.

Next, as shown in FIG. 5B, the conductive layer 147b is formed on the conductive layer 147a and the insulating layer 151. The conductive layer 147b may be formed of substantially the same material as that of, and by substantially the same method as that of, the conductive layer 147a. The conductive layer 147b is formed to be in contact with the conductive layer 147a. As a result, the conductive layer 147a and the conductive layer 147b are in contact with each other at both of two ends of the insulating layer 151.

Figure 5C:
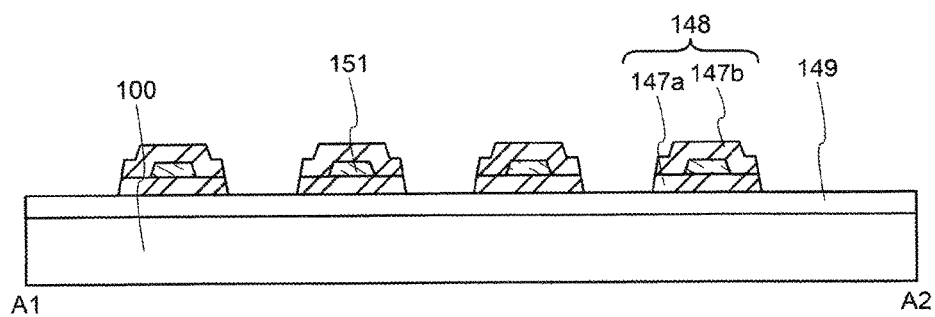
FIG. 5C is a cross-sectional view showing the manufacturing method for the lines and the vicinity thereof in an embodiment according to the present invention.

Next, as shown in FIG. 5C, the conductive layer 147a and the conductive layer 147b are processed to have a predetermined shape. The conductive layer 147a and the conductive layer 147b may be processed in the same step or separately. In the case where, for example, photolithography and dry etching are used for the processing, the conductive layer 147a and the conductive layer 147b may be processed in the same step so that the processing step is partially omitted. The conductive layer 147a and the conductive layer 147b are processed such that portions thereof in contact with each other at both of the two ends of the insulating layer 151 remain. As a result, the insulating layer 151 is covered with the conductive layer 147a and the conductive layer 147b. Therefore, the lines 148 are formed.

Figure 5D:
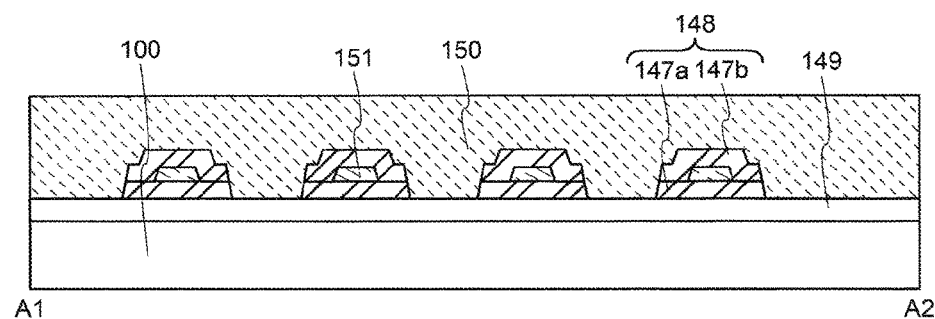
FIG. 5D is a cross-sectional view showing the manufacturing method for the lines and the vicinity thereof in an embodiment according to the present invention.

Next, as shown in FIG. 5D, the insulating layer 150 is formed on the insulating layer 149 and the conductive layer 147b. The insulating layer 150 may be formed of substantially the same material as that of, and by substantially the same method as that of, the insulating layer 151. For example, the insulating layer 150 may be formed of acrylic resin by spin-coating. The insulating layer 150 is formed to have a flat top surface. It is preferable that the insulating layer 150 is formed to have a thickness of 1 μm or greater.

By the above-described manufacturing method, the lines 148 and the elements in the vicinity thereof are formed. In this state, the insulating layer 151 is covered with the conductive layer 147a and the conductive layer 147b. Therefore, a line structure in which the insulating layer 151 acts as a core and the conductive layer 147a and the conductive layer 147b act as a conductive portion is formed. The lines 148 formed by the above-described manufacturing method are expected to have an improved bending durability in the direction in which the lines 148 extend. The lines 148 formed by the above-described manufacturing method have an increased cross-sectional area size, and therefore, are expected to have a decreased line resistance.

(4. Other Elements of the Display Device)

Figure 6:
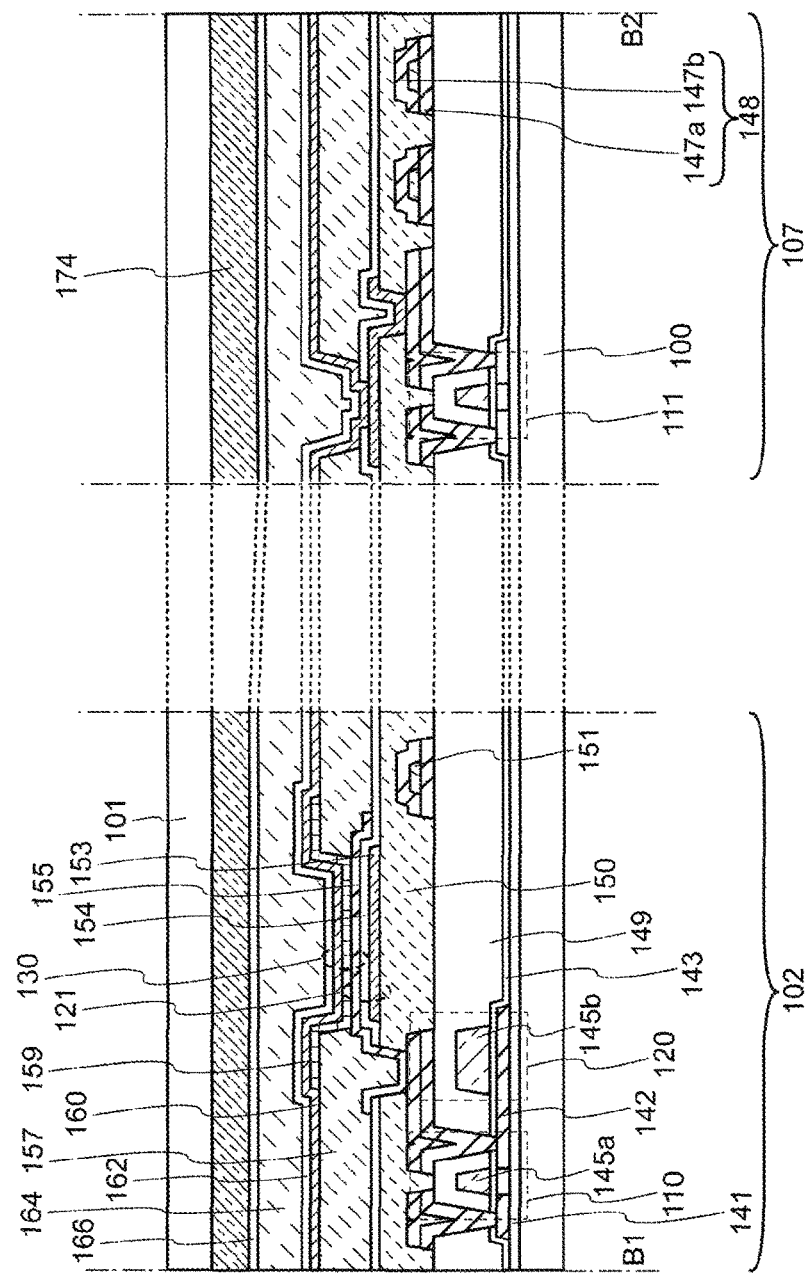
FIG. 6 is a cross-sectional view showing a structure of the display device in an embodiment according to the present invention.

Hereinafter, other elements of the display device 10 will be described. FIG. 6 is a cross-sectional view of the pixels 102 and the driving circuit 107 taken along line B1-B2 in FIG. 1A. The insulating layer 149, the conductive layer 147a, the conductive layer 147b, the lines 148, the insulating layer 151 and the insulating layer 150 shown in FIG. 1B have the same structures, are formed of the same materials and have the same functions also in FIG. 6.

(4-1. Structure of Transistors)

The transistor 110 includes a semiconductor layer 142, a gate insulating layer 143, a gate electrode layer 145a, and the like. The transistor 111 has substantially the same structure. In FIG. 6, the transistor 110 has a top gate/top contact structure. The transistor 110 is not limited to having such a structure, and may have a bottom gate structure or a bottom contact structure.

The substrate 100 is formed of glass or an organic resin material. Therefore, the substrate 100 may be expressed as having an insulating surface. An insulating layer 141 is provided on the substrate 100, and has a function of an underlying layer. The insulating layer 141, with this function, may suppress impurities, typically, an alkaline metal material, water, hydrogen or the like from being diffused from the substrate 100 into the semiconductor layer 142. Another substrate 101 is formed of substantially the same material as that of the substrate 100.

The semiconductor layer 142 is provided on the insulating layer 141, and is formed of silicon, an oxide semiconductor, an organic semiconductor or the like. The gate insulating layer 143 is provided on the insulating layer 141 and the semiconductor layer 142. The gate insulating layer 143 may be formed of an inorganic material having a high dielectric constant such as silicon oxide, silicon nitride, silicon oxide nitride, or the like. The gate electrode layer 145a is provided on the gate insulating layer 143. The gate electrode layer 145a has substantially the same function as that of the lines 146 shown in FIG. 1A. A capacitance electrode layer 145b is provided on the gate insulating layer 143 like the gate electrode layer 145a. Some of the lines 148 have a function of source/drain electrode. Such lines 148 do not need to include the insulating layer 151.

(4-2. Structure of the Capacitance Element)

A capacitance element 120 includes the gate insulating layer 143 as a dielectric element and also includes a source or drain region of the semiconductor layer 142 and the capacitance electrode layer 145b. A capacitance element 121 includes an insulating layer 154 as a dielectric element and also includes a conductive layer 153 and a pixel electrode 155.

(4-3. Structure of the Display Element)

A light emitting element 130 includes the pixel electrode 155, an organic EL layer 159 and a counter electrode layer 160. In an embodiment according to the present invention, the light emitting element 130 has a so-called top emission structure, in which light emitted by the organic EL layer 159 is output toward the counter electrode layer 160. The light emitting element 130 is not limited to having a top emission structure, and may have a bottom emission structure.

The pixel electrode 155 has a function of an anode electrode of the display element 130, and preferably has a property of reflecting light in the case where the display element 130 has a top emission structure. The organic EL layer 159 is provided on the pixel electrode 155, and is formed of a light emitting material such as an organic electroluminescence material. The organic EL layer 159 is formed of a low molecular weight-type or high molecular weight-type organic material. The counter electrode layer 160 has a function of a cathode electrode of the display element 130, and is provided to overlap and cover the pixel electrode 155. In the case where the display device 10 has a top emission structure, the counter electrode layer 160 is formed of a material that is conductive and light-transmissive in order to transmit light emitted by the organic EL layer 159. A bank layer 157 covers a peripheral region of the pixel electrode 155. The bank layer 157 is formed of an organic resin material.

(4-4. Structure of the Sealing Layer and the Adhesive Layer)

An inorganic insulating layer 162, an organic insulating layer 164 and an inorganic insulating layer 166 are sequentially stacked in this order and act as a sealing layer. The substrate 101 may be provided on the inorganic insulating layer 166 with an adhesive layer 174 being provided between the substrate 101 and the inorganic insulating layer 166. The adhesive layer 174 is formed of an inorganic material, an organic material, or a composite material of an organic material and an inorganic material. The substrate 101 may have a function of a counter substrate, or may also has a function of a glass cover of an electronic device or a touch panel substrate.

(5. Manufacturing Method for the Display Device)

Hereinafter, a manufacturing method for the display device 10 will be described with reference to FIG. 7 to FIG. 10.

(5-1. Formation of the Transistors)

Figure 7:
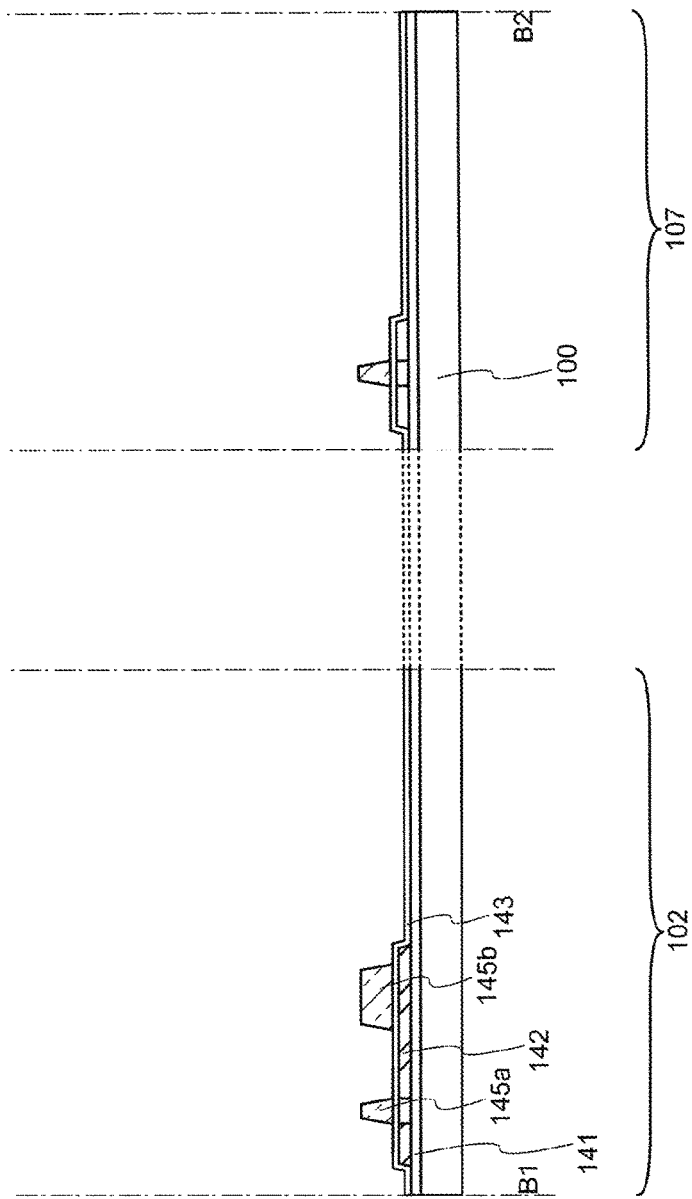
FIG. 7 is a cross-sectional view showing a manufacturing method for the display device in an embodiment according to the present invention.

As shown in FIG. 7, the insulating layer 141, the semiconductor layer 142, and the gate insulating layer 143 are formed on a first surface of the substrate 100 (the first surface is a top surface as seen in a cross-sectional view). Then, the gate electrode layer 145a is formed on the gate insulating layer 143. The above-listed layers may each be appropriately formed by photolithography, nanoimprinting, ink-jetting, etching or the like so as to have a predetermined shape.

In the case where, for example, the substrate 100 is to be an organic resin substrate, a polyimide substrate is used. An organic resin substrate may have a thickness of several micrometers to several ten micrometers, and thus the display device 100 is a flexible sheet display. In the case where the transistor 110 is to be formed on a flexible substrate formed of a resin material, a resin film of polyimide or the like may be formed on the substrate 100, and the substrate 100 may be peeled off when the manufacturing of the display device 10 is finished.

The insulating layer 141 is formed of silicon oxide, silicon nitride, silicon oxide nitride or the like. The insulating layer 141 may have a single layer structure or a stack structure. The insulating layer 141 may be formed by CVD, spin-coating, printing or the like.

In the case where the semiconductor layer 142 is to be formed of silicon, for example, amorphous silicon, polycrystalline silicon or the like is usable. In the case where the semiconductor layer 142 is to be formed of an oxide semiconductor, for example, an oxide semiconductor containing indium, gallium and zinc (IGZO) may be used. The semiconductor layer 142 may be formed by sputtering, vapor deposition, CVD or the like.

The gate insulating layer 143 is formed of an insulating film containing at least one of silicon oxide, silicon nitride, silicon oxide nitride, hafnium oxide and the like. The gate insulating layer 143 may be formed by substantially the same method as that of the insulating layer 141.

The gate electrode layer 145a is formed of the substantially the same material as that of, and by substantially the same method as that of, the conductive layer 147a. The gate electrode layer 145a may be processed by substantially the same method as that of the conductive layer 147a. Specifically, the gate electrode layer 145a is formed of a metal element selected from tungsten, aluminum, chromium, copper, titanium, tantalum, molybdenum, nickel, iron, cobalt, indium and zinc, an alloy containing one of the above-listed metal elements, an alloy of a combination of any of the above-listed metal elements, or the like. For example, the gate electrode layer 145a may have a stack structure including an aluminum (Al) layer and a titanium (Ti) layer that are formed by sputtering.

(5-3. Formation of the Lines)

Figure 8:
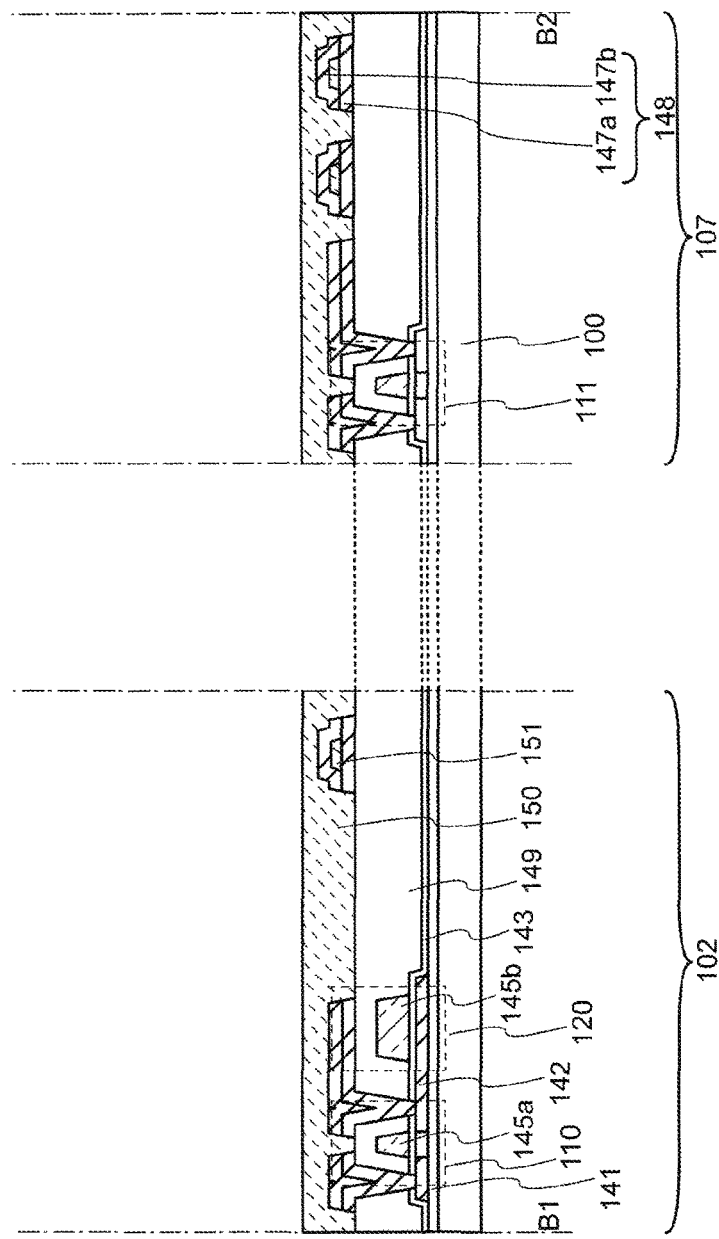
FIG. 8 is a cross-sectional view showing the manufacturing method for the display device in an embodiment according to the present invention.

Next, as shown in FIG. 8, the insulating layer 149, the lines 148, and the insulating layer 150 are formed on the gate insulating electrode layer 145a and the gate insulating layer 143. This step may be performed by the method described above with reference to FIG. 4A to FIG. 5D. A combination of the conductive layer 147a and the conductive layer 147b may act as a source/drain electrode.

(5-3. Formation of the Display Element)

Figure 9:
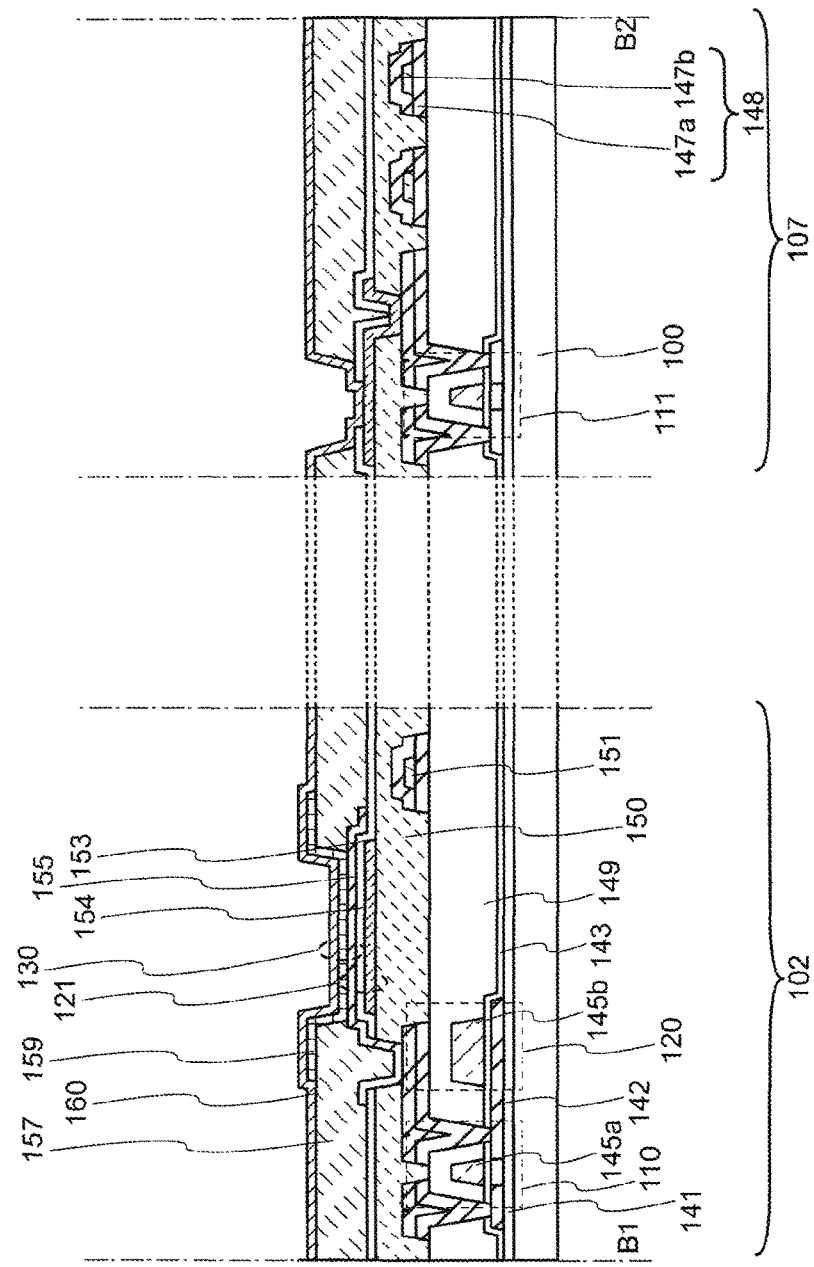
FIG. 9 is a cross-sectional view showing the manufacturing method for the display device in an embodiment according to the present invention.

Next, as shown in FIG. 9, the following components are formed on the insulating layer 150: the capacitance element 121 (formed to include the conductive layer 153, the insulating layer 154 and the pixel electrode 155), the display element 130 (formed to include the pixel electrode 155, the organic EL layer 159 and the counter electrode layer 160), and the bank layer 157.

First, the conductive layer 153 is formed on the insulating layer 150. The conductive layer 153 may be formed of the same material as, or a different material from, that of the gate electrode 145a. Although not shown, the conductive layer in which the conductive layer 153 is provided is also used to form other lines joined with the source/drain electrode. Therefore, this conductive layer needs to, for example, have a low resistance and join well with the conductive material used to form the conductive layer 147b (part of the source/drain electrode). For example, the conductive layer 153 may have a stack structure of molybdenum, aluminum and molybdenum formed by sputtering.

Next, the insulating layer 154 is formed on the conductive layer 153. The insulating layer 154 may be formed by substantially the same method as that of the insulating layer 141 or the gate insulating layer 143. For example, the insulating layer 154 may be formed of silicon nitride by plasma CVD.

Next, as shown in FIG. 9, the pixel electrode 155 is formed on the insulating layer 154. The pixel electrode 155 may be formed of, for example, a light-reflective metal material such as aluminum (Al), silver (Ag) or the like, or may have a stack structure including a transparent conductive layer of ITO (Indium Tin Oxide) or IZO (Indium Zinc Oxide) having a high capability of hole injection and a light-reflective metal layer.

Next, the bank layer 157 is formed on the insulating layer 154 and the pixel electrode 155. The bank layer 157 is formed of an organic resin material such as acrylic resin or polyimide resin. The bank layer 157 is formed to cover an end of the pixel electrode layer 157, and has an opening formed therein to expose a top surface of the pixel electrode 155. It is preferable that an edge of the opening in the bank layer 157 is tapered mildly. For example, the bank layer 157 may be formed of polyimide resin by spin-coating.

Next, the organic EL layer 159 is formed on the pixel electrode 155 and the bank layer 157. In the case of being formed of a low molecular weight-type organic material, the organic EL layer 159 may include a light emitting layer containing a light emitting organic material and also include a hole injection layer and an electron injection layer or may further include a hole transfer layer and an electron transfer layer, for example. The hole injection layer and the electron injection layer, or the hole transfer layer and the electron transfer layer, when being included, are provided so as to have the light emitting layer therebetween. The organic EL layer 159 may have a structure in which the light emitting layer is sandwiched between the hole injection layer and the electron injection layer. The organic EL layer 159 may further include a hole block layer, an electron block layer and the like in addition to the hole transfer layer, the hole injection layer, the electron transfer layer and the electron injection layer.

The organic EL layer 159 is formed to at least overlap the pixel electrode 155 exposed by the opening in the bank layer 157. The organic EL layer 159 is formed by, for example, vacuum vapor deposition, printing, spin-coating or the like. In the case of being formed by vacuum vapor deposition, the organic EL layer 159 may be formed by use of a shadow mask optionally, so that the organic EL layer 159 is not formed on the entirety of the bank layer 157. The organic EL layer 159 may be formed of different materials among pixels adjacent to each other, or may be formed of the same material in all the pixels.

Next, the counter electrode layer 160 is formed to overlap the pixel electrode 155 and the organic EL layer 159. The counter electrode layer 160 may be formed of a transparent conductive material such as ITO (indium tin oxide), IZO (indium zinc oxide) or the like, or an alloy of magnesium (Mg) and silver and (Ag). The counter electrode layer 160 may be formed by sputtering or vacuum vapor deposition.

(5-4. Formation of the Sealing Layer)

Figure 10:
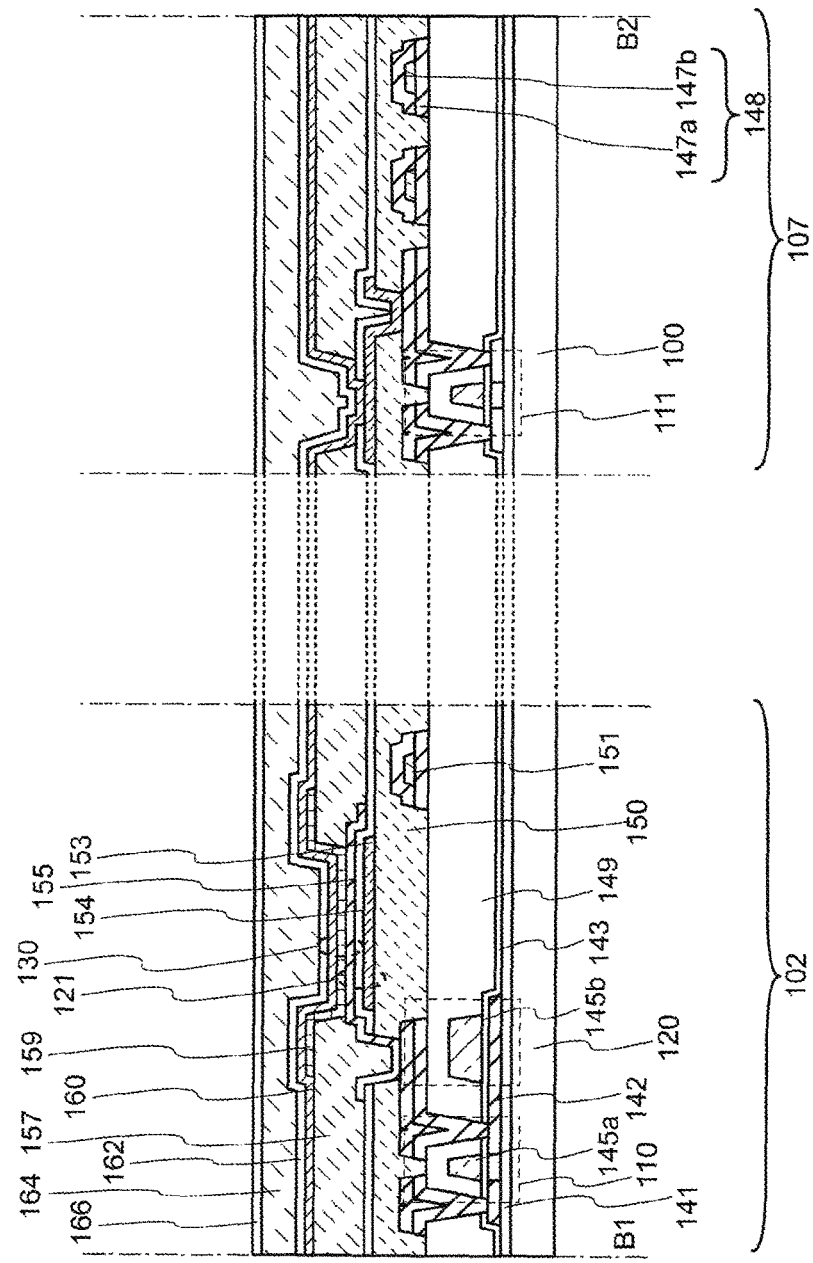
FIG. 10 is a cross-sectional view showing the manufacturing method for the display device in an embodiment according to the present invention.

Next, as shown in FIG. 10, the inorganic insulating layer 162, the organic insulating layer 164 and the inorganic insulating layer 166 forming the sealing layer are sequentially formed on the counter electrode layer 160 and the bank layer 157.

The inorganic insulating layer 162 and the inorganic insulating layer 166 may be formed of an insulating material containing at least one of aluminum oxide, silicon oxide, silicon nitride and the like. It is preferable that the display region 103 is covered with the inorganic insulating layer 162. The inorganic insulating layer 162 and the inorganic insulating layer 166 may each be formed by plasma CVD, thermal CVD, vapor deposition, spin-coating, spraying, or printing. For example, the inorganic insulating layer 162 and the inorganic insulating layer 166 may each have a stack structure of silicon nitride and silicon oxide formed by plasma CVD. The inorganic insulating layer 162 and the inorganic insulating layer 166 may each have a thickness of several ten nanometers to several micrometers.

The organic insulating layer 164 may be formed of an organic resin material such as acrylic resin, polyimide resin, epoxy resin or the like. The organic insulating layer 164 may be formed by spin-coating, vapor deposition, spraying, ink-jetting, printing or the like to have a thickness of approximately several micrometers to approximately several ten micrometers.

In a final step, the adhesive layer 174 is formed on the inorganic insulating layer 166 and bonded with the substrate 101. Thus, the display device 10 is manufactured. The display device 10 manufactured by the above-described method has the bending durability of the lines improved and also has local deformation suppressed. For such advantages, the lines 148 may be provided below the organic EL layer 159. Therefore, it is expected that the light emitting element 130 is suppressed from being broken and that the organic EL layer 159 is suppressed from being delaminated. In addition, the bending durability of the display device 10 is improved with no need to provide a protective sheet against folding. This decreases the number of required components. Since the cross-sectional area size of the lines is increased, and thus the line resistance is decreased. Therefore, the driving circuits are decreased in size, which decreases the area size of the peripheral region 104 having a frame shape and also increases the level of definition of the pixels 102.

The lines having the above-described structure (e.g., the lines 148) extend in one direction. Therefore, the display device 10 is easily folded in a direction perpendicular to the direction in which the lines 148 extend. Thus, the display device 10 may have both a property of being easily foldable and a property of not being easily foldable. The lines of different types may be selected in accordance with whether each of regions is wished to be folded or not. Thus, the degree of designing freedom of the flexible display device is improved.

(Embodiment 2)

The lines 148 having a different structure from that of, and formed by a different method from that of, embodiment 1 will be described with reference to the drawings. The structure and the method described in embodiment 1 may be applicable to this embodiment except for differences of embodiment 2 from embodiment 1.

Figure 11A:
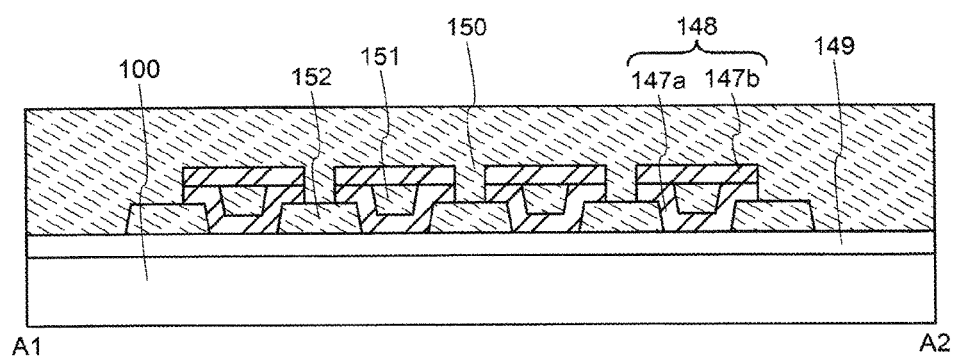
FIG. 11A is a cross-sectional view showing lines and the vicinity thereof in an embodiment according to the present invention.
Figure 11B:
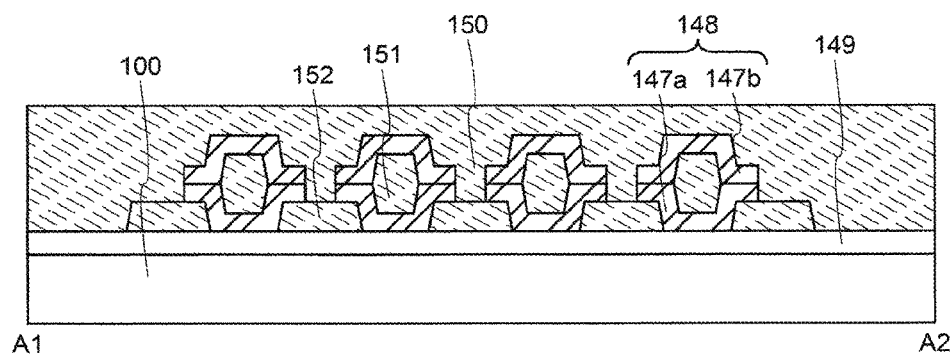
FIG. 11B is a cross-sectional view showing lines and the vicinity thereof in an embodiment according to the present invention.

FIG. 11A and FIG. 11 B are each a cross-sectional view of the lines 148 and the vicinity thereof. As shown in FIG. 11A and FIG. 11B, an insulating layer 152 is provided in the form of ribs on the insulating layer 149 so as to be in contact with a bottom part of the lower conductive layer 147a of each line 148. As a result, the conductive layer 147a and the insulating layer 151 protrude downward. The insulating layers 152 may be formed of substantially the same material as that of the insulating layer 151.

The conductive layer 147b may be flat as seen in a cross-sectional view as shown in FIG. 11A. Alternatively, as shown in FIG. 11B, the conductive layer 147b may protrude upward as seen in a cross-sectional view. In the case where the conductive layer 147b has the shape shown in FIG. 11B, the bending durability of the line 148 is further improved, and the cross-sectional area size of the conductive layer 147b is increased and thus the line resistance is further decreased.

FIG. 12A, FIG. 12B, FIG. 12C, FIG. 12D, FIG. 13A, FIG. 13B, FIG. 14A and FIG. 14B show a method for forming the lines 148 and the vicinity thereof.

Figure 12A:
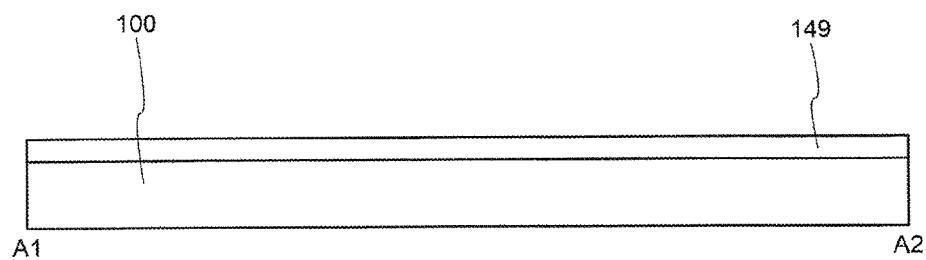
FIG. 12A is a cross-sectional view showing a manufacturing method for the lines and the vicinity thereof in an embodiment according to the present invention.
Figure 12B:
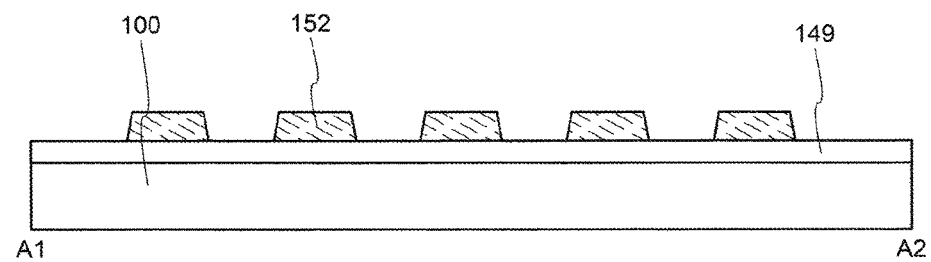
FIG. 12B is a cross-sectional view showing the manufacturing method for the lines and the vicinity thereof in an embodiment according to the present invention.
Figure 12C:
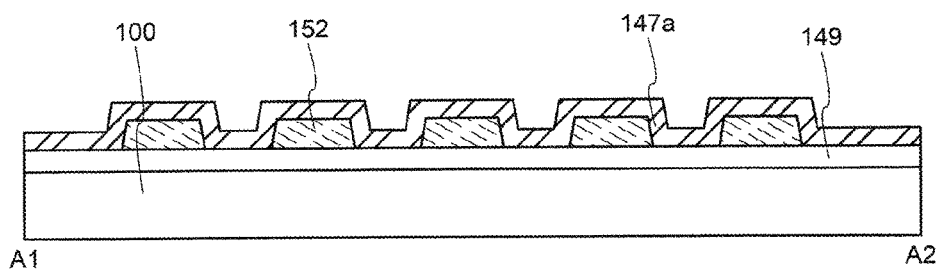
FIG. 12C is a cross-sectional view showing the manufacturing method for the lines and the vicinity thereof in an embodiment according to the present invention.

As shown in FIG. 12A, first, the insulating layer 149 is formed on the substrate 100. Next, as shown in FIG. 12B, the insulating layer 152 is formed on the insulating layer 149. The insulating layer 152 may be formed of substantially the same material as that of, and by substantially the same method as that of, the insulating layer 150 and the insulating layer 151. The insulating layer 152 may be formed of acrylic resin by spin-coating. The insulating layer 152 may be processed into a predetermined shape as shown in FIG. 12B by, for example, photolithography and etching.

Figure 12D:
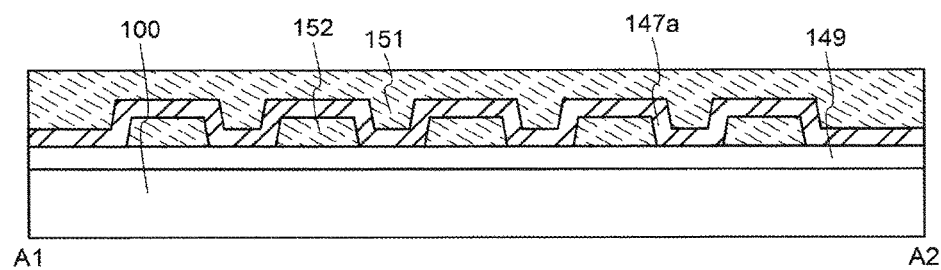
FIG. 12D is a cross-sectional view showing the manufacturing method for the lines and the vicinity thereof in an embodiment according to the present invention.
Figure 13A:
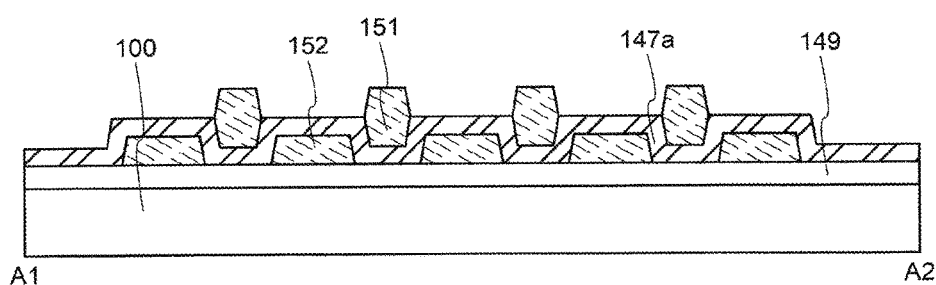
FIG. 13A is a cross-sectional view showing the manufacturing method for the lines and the vicinity thereof in an embodiment according to the present invention.

The conductive layer 147a is formed on the insulating layer 149 and the insulating layers 152 (see FIG. 12C), and the insulating layer 151 is formed thereon (see FIG. 12D). The insulating layer 151 is processed into a predetermined shape as shown in FIG. 13A.

Figure 13B:
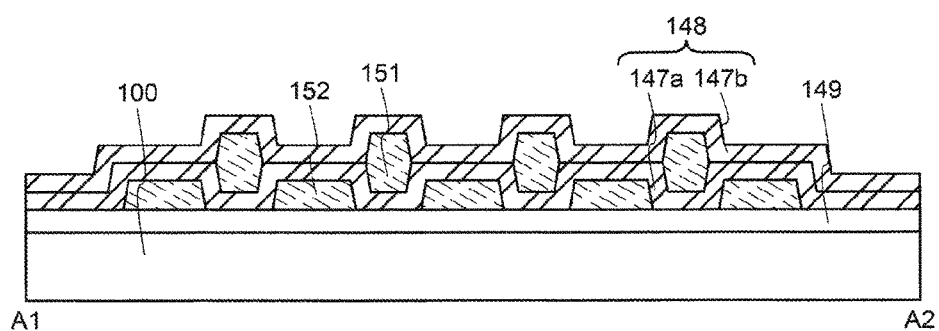
FIG. 13B is a cross-sectional view showing the manufacturing method for the lines and the vicinity thereof in an embodiment according to the present invention.
Figure 14A:
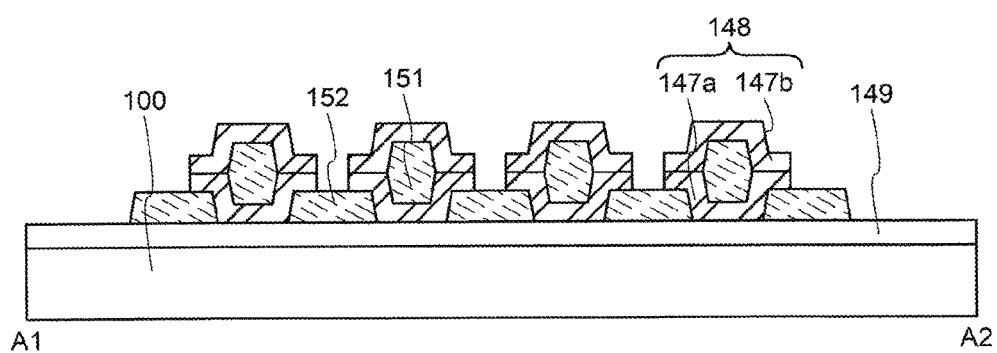
FIG. 14A is a cross-sectional view showing the manufacturing method for the lines and the vicinity thereof in an embodiment according to the present invention.

Next, the conductive layer 147b is formed on the conductive layer 147a and the insulating layer 151 (see FIG. 13B). The conductive layer 147b is formed to be in contact with the conductive layer 147a. Next, as shown in FIG. 14A, the conductive layer 147a and the conductive layer 147b are processed into a predetermined shape. The conductive layer 147a and the conductive layer 147b may be processed in the same step or separately.

Figure 14B:
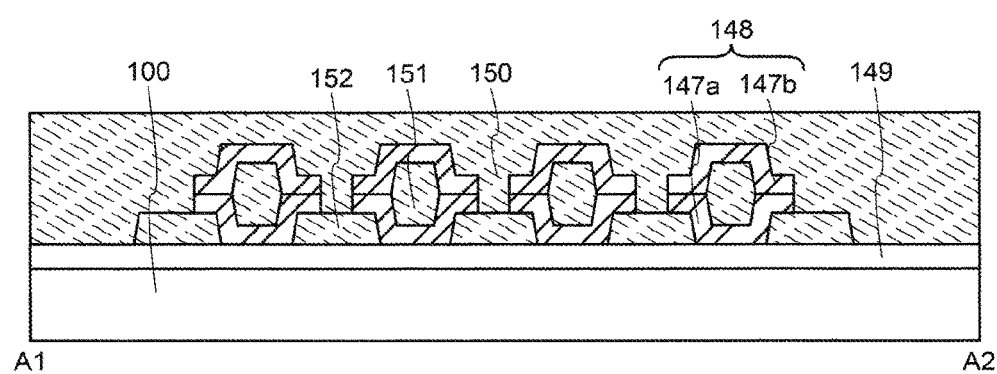
FIG. 14B is a cross-sectional view showing the manufacturing method for the lines and the vicinity thereof in an embodiment according to the present invention.

In a final step, as shown in FIG. 14B, the insulating layer 150 is formed on the insulating layer 149, the insulating layer 152 and the conductive layer 147b.

Figure 15:
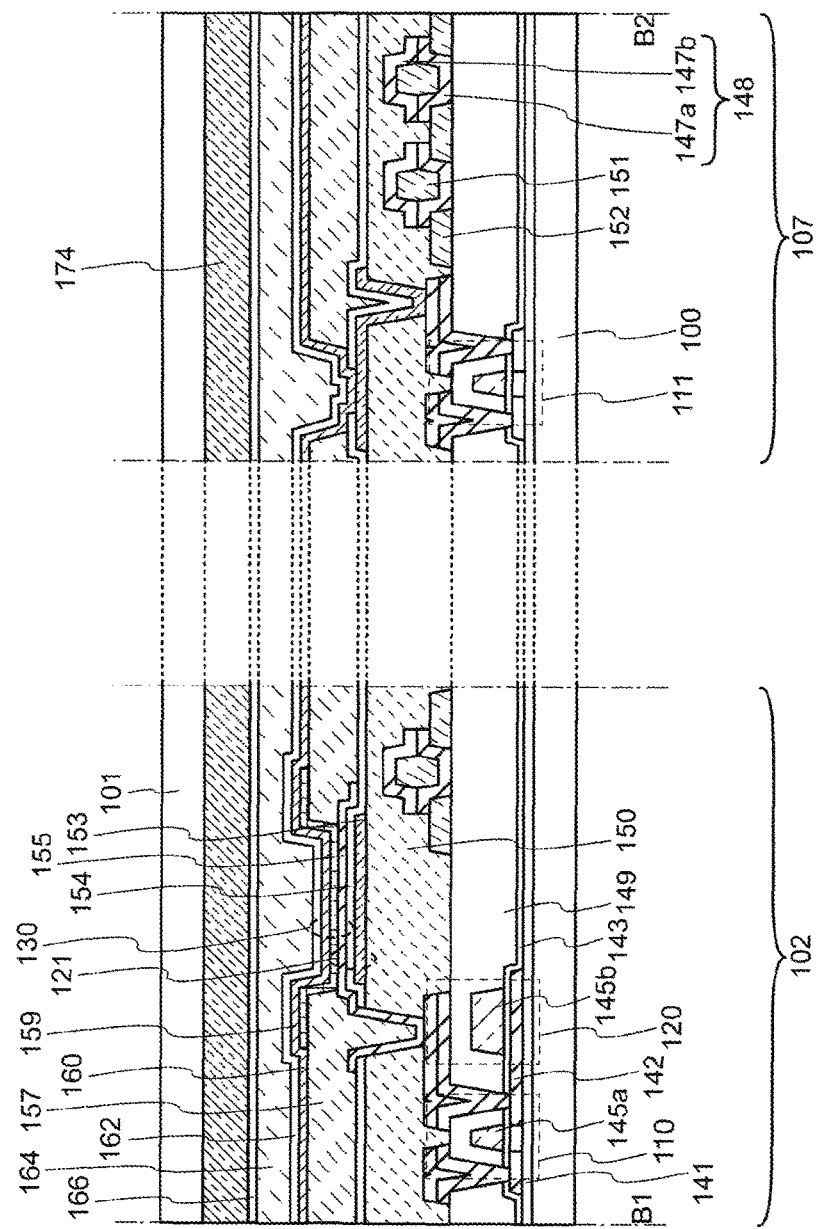
FIG. 15 is a cross-sectional view showing a structure of a display device in an embodiment according to the present invention.

FIG. 15 is a cross-sectional view of the display device 10 including the lines 148 shown in FIG. 11B. Unlike in the display device 10 in embodiment 1 shown in the cross-sectional view of FIG. 6, in the display device 10 in embodiment 2, the insulating layer 152 is included and the conductive layer 147a and the insulating layer 151 protrude downward.

With the above-described structure, the bending durability of the lines 148 is further improved, and the line resistance of the lines 148 is further decreased. Therefore, it is expected to suppress display faults, to increase the level of definition of the pixels 102, and to decrease the area size of the peripheral region 104 having a frame shape.

In the above-described embodiments, the lines 148 are formed on the insulating layer 149. The present invention is not limited to having such a structure. For example, the lines 148 may be formed on another insulating layer, or such structures may be combined. Further, the lines 148 is not limited to being formed in a display device, and may be formed in another device (a wiring board and the like). For example, the another device includes at least a first conductive layer, a second conductive layer and a resin layer between the first conductive layer and the second conductive layer.

In the above-described embodiments, the present invention is applied to an organic EL display device as an example. The present invention is also applicable to a liquid crystal display device, any other self-light emitting display device, an electronic paper-type display device including an electrophoretic display element or the like, or any other flat panel display device. The present invention is applicable to any size of display device from a small or middle display device to a large scale display device, needless to say.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:

1. A semiconductor device, comprising:
a substrate having an insulating surface;
a circuit including a transistor on the insulating surface and including a semiconductor layer, a first insulating layer and a conductive layer; and
a line on the insulating surface, the line extending in a first direction,
wherein the line includes a core containing a resin material and a conductive portion covering the core as seen in a cross-sectional view taken along a second line crossing the first direction,
the conductive portion includes a first conductive layer and a second conductive layer,
a first end of the first conductive layer is in contact with a first end of the second conductive layer at a first region, and
a second end of the first conductive layer is in contact with a second end of the second conductive layer at a second region.

2. The semiconductor device according to claim 1, further comprising a second insulating layer in contact with a top portion or a bottom portion of the conductive portion.

3. The semiconductor device according to claim 1, wherein
the core is between the first region and the second region in a planar view.

4. The semiconductor device according to claim 3, wherein a side surface of the first conductive layer and a side surface of the second conductive layer have portions continuous with each other.

5. The semiconductor device according to claim 1, wherein an end of the first conductive layer is inner to, or outer to, an end of the second conductive layer.

6. The semiconductor device according to claim 1, wherein the substrate is flexible.

7. A display device, comprising:
a substrate having an insulating surface; and
a display region,
wherein
the display region includes a plurality of pixels each including a transistor, the transistor being on the insulating surface and including a semiconductor layer, a first insulating layer and a conductive layer,
the display region further includes a plurality of scanning lines extending in a first direction, a plurality of signal lines extending in a second direction crossing the first direction, and a plurality of power supply lines extending in the first direction or the second direction,
each of the plurality of scanning lines, each of the plurality of signal lines or each of the power supply lines includes a core containing a resin material and a conductive portion covering the core in a cross-sectional view taken along a line crossing the first direction and the second direction,
the conductive portion includes a first conductive layer and a second conductive layer,
a first end of the first conductive layer is in contact with a first end of the second conductive layer at a first region, and
a second end of the first conductive layer is in contact with a second end of the second conductive layer at a second region.

8. The display device according to claim 7, further comprising a second insulating layer provided in contact with a top portion or a bottom portion of the conductive portion.

9. The display device according to claim 7, wherein
the core is between the first region and the second region in a planar view.

10. The display device according to claim 9, wherein a side surface of the first conductive layer and a side surface of the second conductive layer have portions continuous with each other.

11. The display device according to claim 7, wherein an end of the first conductive layer is inner to, or outer to, an end of the second conductive layer.

12. The display device according to claim 7, wherein the substrate is flexible.

13. A manufacturing method for a semiconductor device, the method comprising:
forming a first conductive layer extending in a first direction on a substrate having an insulating surface;
forming a resin layer extending in the first direction on the first conductive layer so as to expose both of two ends of the first conductive layer; and
forming a second conductive layer extending in the first direction on the first conductive layer and the resin layer, wherein
a first end of the first conductive layer is in contact with a first end of the second conductive layer at a first region, and
a second end of the first conductive layer is in contact with a second end of the second conductive layer at a second region.

14. The manufacturing method according to claim 13, further comprising forming an insulating layer covering the insulating surface and the second conductive layer.

15. The manufacturing method according to claim 13, wherein the resin layer is provided between the first region and the second region in a planar view.

* * * * *